United States Patent [19]
Furuya et al.

[11] Patent Number: 5,364,717
[45] Date of Patent: Nov. 15, 1994

[54] METHOD OF MANUFACTURING X-RAY EXPOSURE MASK

[75] Inventors: Kazuhito Furuya, Yokohama; Yasuyuki Miyamoto, Higashikurume, both of Japan

[73] Assignee: Tokyo Institute of Technology, Meguro, Japan

[21] Appl. No.: 953,669

[22] Filed: Oct. 1, 1992

[30] Foreign Application Priority Data

Apr. 7, 1992 [JP] Japan .................. 4-085558

[51] Int. Cl.$^5$ .............................................. G03F 9/00
[52] U.S. Cl. .................... 430/5; 430/321; 378/34; 378/35; 437/107
[58] Field of Search ............ 430/5, 22, 269, 321, 430/311, 396; 378/35, 34; 437/107

[56] References Cited

U.S. PATENT DOCUMENTS 5,051,326  9/1991  Celler et al. .................. 430/966

OTHER PUBLICATIONS

"Fabrication of Ultrafine X-Ray Mask Using Precise Crystal Growth Technique", Miyamoto et al., Japan Jour. of Applied Physics, vol. 31, No. 4A, pp. L432–L435. 1 Apr. 1992.

"An X-Ray Mask Using TA and Heteroepitaxially Grown SIC", Yamada et al., 8226 Microelectronic Engineering 9(1989) May, Nos. 1–4, Amsterdam, NL, pp. 135–138.

Primary Examiner—Steve Rosasco
Attorney, Agent, or Firm—Spencer, Frank & Schneider

[57] ABSTRACT

The present invention relates to a method of manufacturing an exposure mask having an unprecedented supermicrostructure for an X-ray exposure method favorable for conventional supermicro exposure using lithography techniques. The method of manufacturing an X-ray exposure mask comprises the steps of alternately laminating two kinds of compound semiconductors as a thin film having a periodic structure with controllability of about one atomic layer on a substrate selectively etching only one material for forming the periodic structure, forming an uneven difference between adjacent layers of the laminate body, and manufacturing a mask for exposing streaks on a desired resist with the aid of a difference of X-rays absorption amounts between each layer by exposing X-ray in parallel to the direction of the laminate layer.

5 Claims, 10 Drawing Sheets

FIG_1A
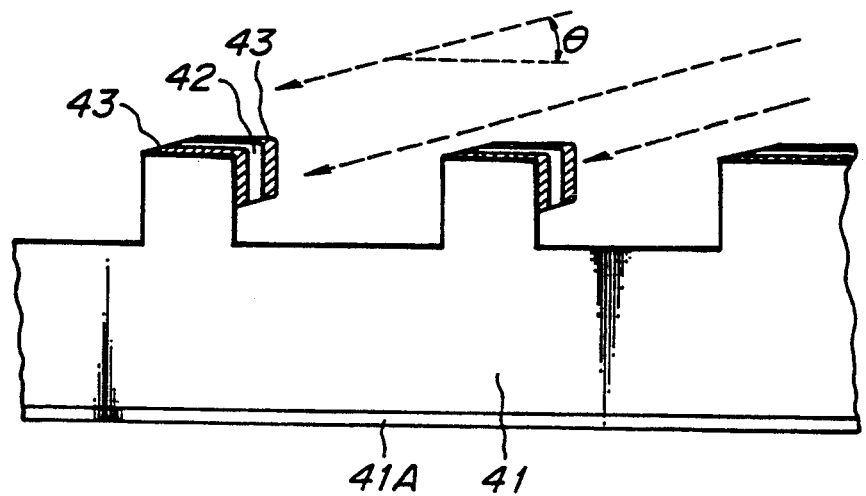
FIG_1B
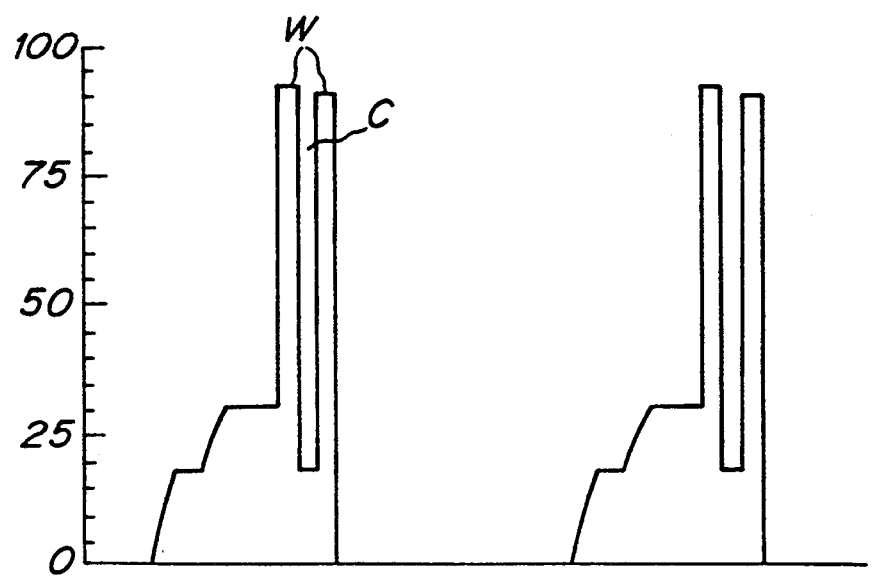

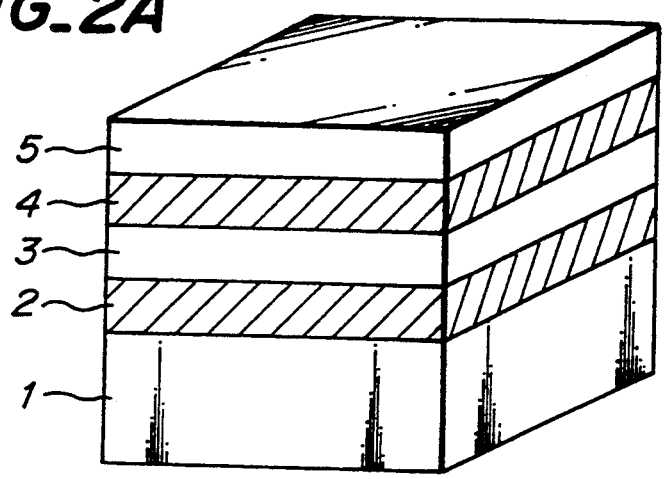
FIG_2A
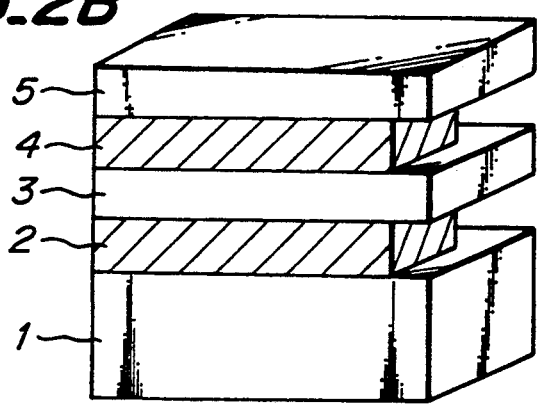
FIG_2B
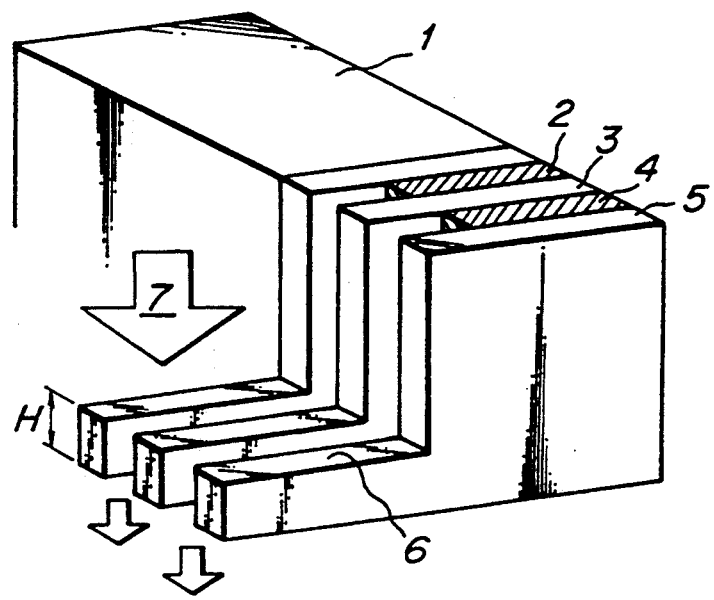
FIG_3

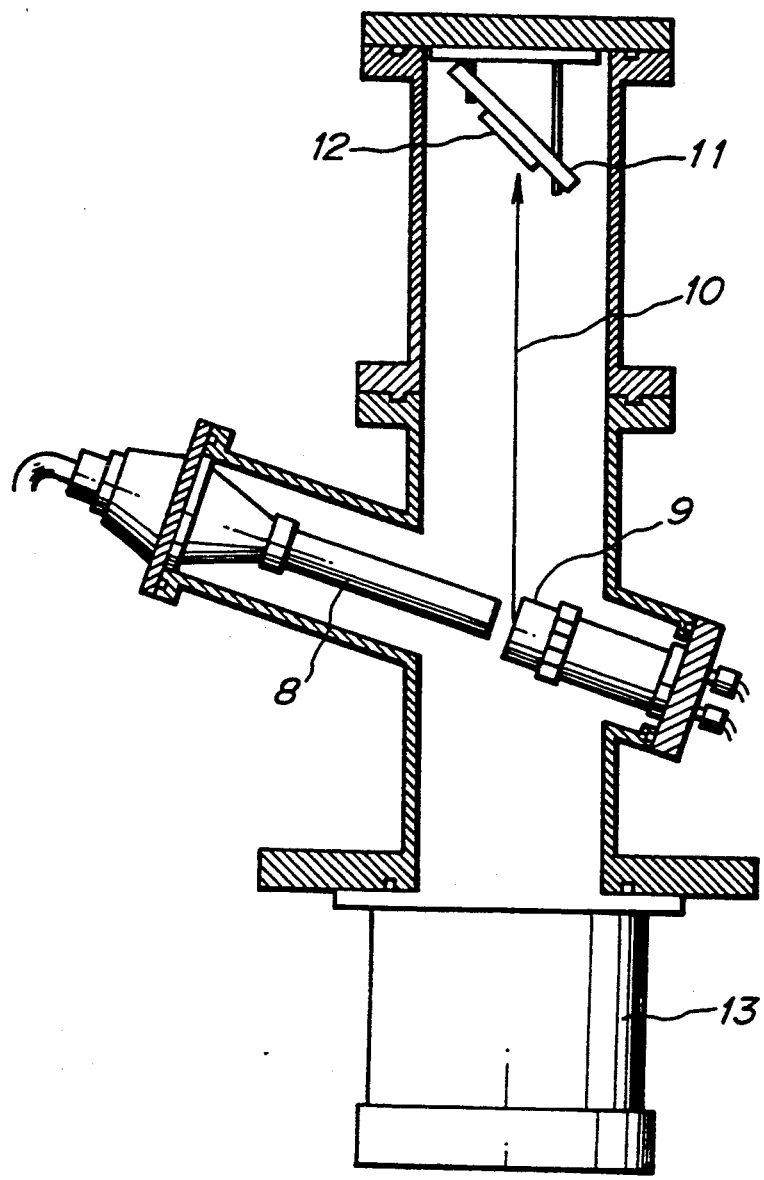
FIG_4

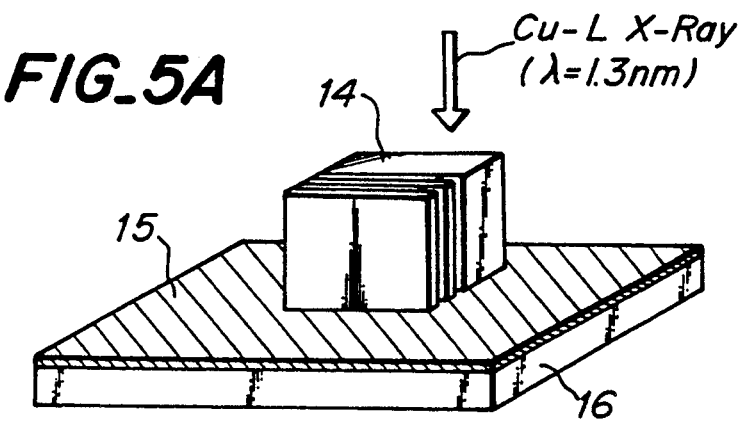
*FIG._5A*
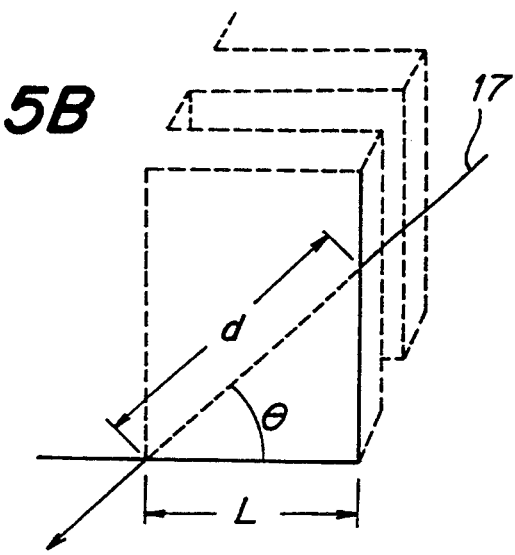
*FIG._5B*
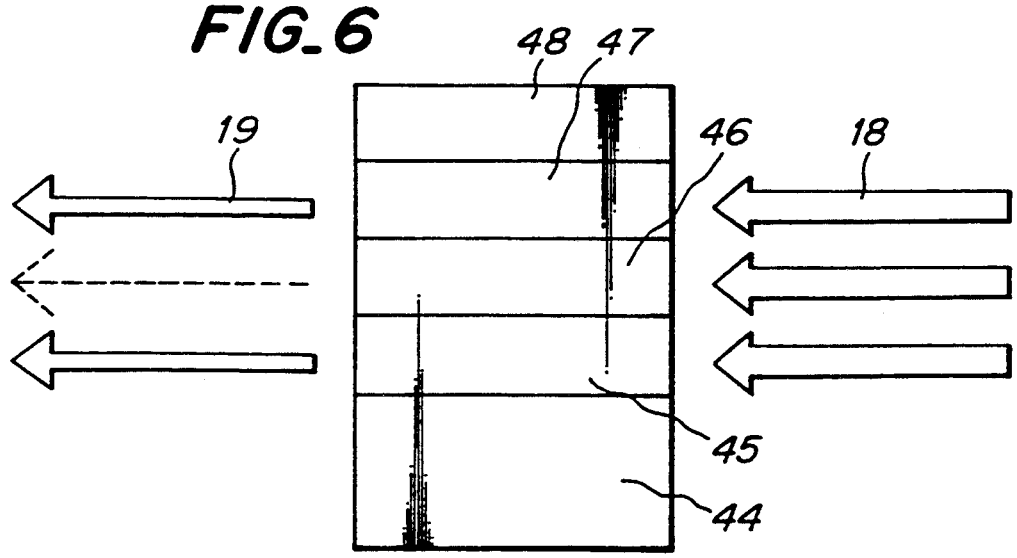
*FIG._6*

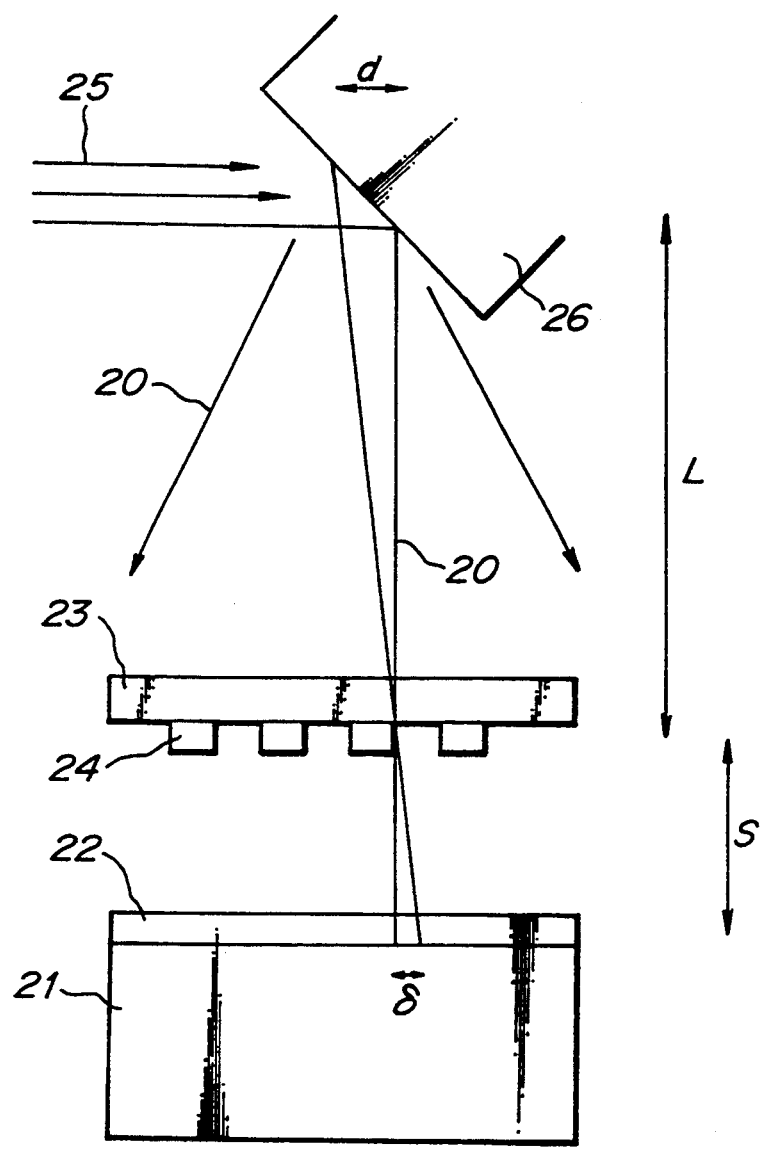
FIG_10

FIG_11A
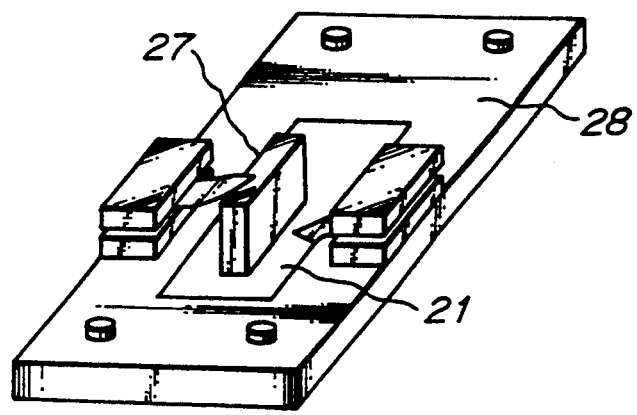
FIG_11B
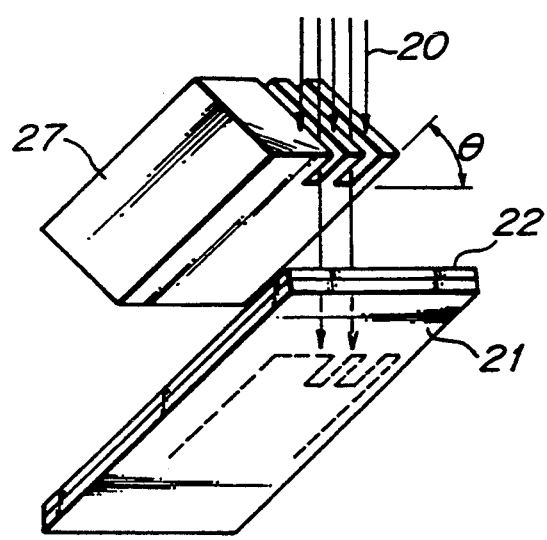

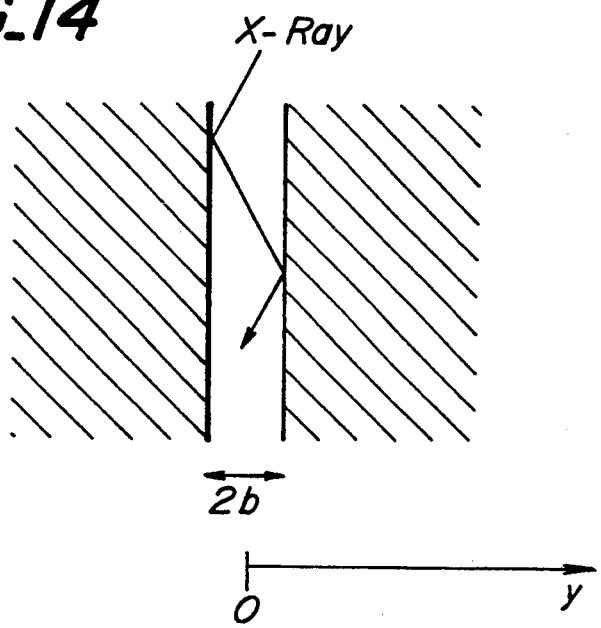
FIG_14
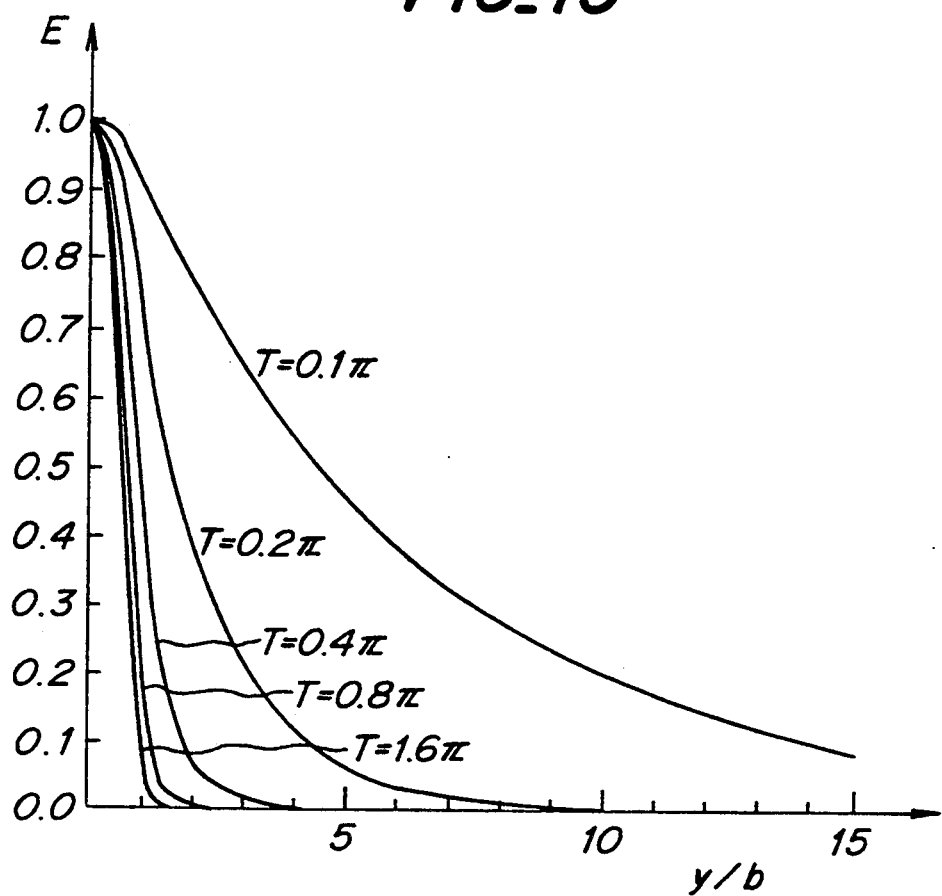
FIG_15

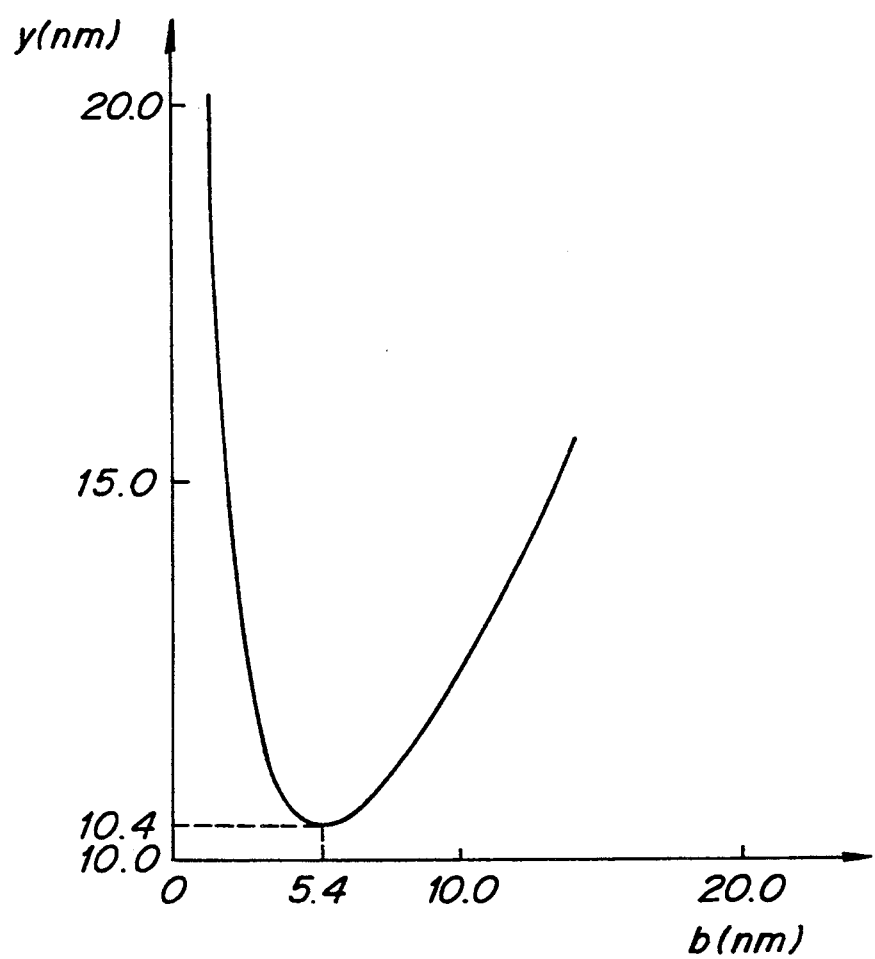
FIG_16

METHOD OF MANUFACTURING X-RAY EXPOSURE MASK

BACKGROUND OF THE INVENTION

1. Field of Invention

The present invention relates to a method of manufacturing an exposure mask having an unprecedented supermicrostructure for carrying out an X-ray exposure method favorable for conventional supermicro exposure. The method employs lithography techniques to achieve microminiaturization resulting in better performance of high density integrated circuits and transistors for use in the electronics field.

2. Description of the Related Art

X-ray exposure lithography shows promise for providing a process that will achieve a breakthrough beyond the limits of present optical lithography techniques, as shown in FIGS. 1A and 1B.

However, X-ray exposure methods are proving difficult to implement. As a mask for preventing X-rays, a fine pattern of metal such as gold, tungsten and the like must be formed on a thin film. At present, an electron beam exposure method is being widely used as a technique which is not mass-producible but can draw a comparatively fine pattern. Consequently, frequent attempts have been made to form a fine metal pattern in combination with this exposure method using etching, lift-off and plating methods. However, it is very difficult to form a superfine metal pattern having a sufficient thickness by scattering electron beams in a resist or in structures under a resist such as a metal substrate or the like. This problem of supermicrostructure in electron beam exposure methods, limits supermicro-structures to about 10 nm of frequency at present.

On the other hand, in the formation of a layer structure, it is easy to provide film thickness controllability of about 1 nm. Oblique deposition is one example of a mask using the layer structure (see Appln. Phys. Lett., 36 (1), 1 Jan. 1980, American Institute of Physics). According to this method, as shown in FIGS. 1A and 1B, a mask having about a 2 nm minimum ray width is formed on a periodically square-wave polyimide membrane by oblique deposition of carbon and tungsten, and a fine ray structure of up to 17.5 nm. However, the use of an oblique deposition method cannot minimize the period of a square wave.

At present, a thin film crystal growth method is the most closely studied method of forming a layer structure, and particularly in compound semiconductor crystal growth, composition switching controllability of less than one atomic layer is possible. At the same time, it is possible to grow crystal on the whole side surface of a deep groove. These advantages are due to crystal growth under such condition that migration of a growing seed on the crystal surface is selected to be large thereby maintaining flatness. Moreover, if thin film crystal growth is carried out by using single atomic layer epitaxial techniques, it is possible to form a thin film to within one atomic layer interval on the whole growth surface.

X-ray exposure is a method of going beyond the limits of optical wavelengths in the conventional exposure techniques. However, the difficulty of manufacturing an exposure mask has emerged as a new problem. That is, it is very difficult to form a very fine mask which can prevent penetration by X-rays on the order of 10 nm as required for an X-ray mask.

SUMMARY OF THE INVENTION

The present invention is to obviate said shortcoming of the conventional methods and to provide a method of forming an X-ray mask having an ultra-fine structure.

One object of the present invention is to provide a method of forming an X-ray exposure mask with a fine structure having a precision of less than one atomic layer and an X-ray mask having an unprecedented tight supermicrostructure forming a thin film for a mask on a side surface of a groove having narrow spaces by using a thin film crystal growth method.

Another object of the present invention relates to a method of manufacturing an X-ray exposure mask comprising the steps of alternately laminating two kinds of compound semiconductors as a thin film having a periodic structure with controllability of about one atomic layer on a substrate, selectively etching only one material forming the periodic structure, forming an uneven difference between adjacent layers of said laminate body, and manufacturing a mask for exposing stripes on a desired resist with the aid of a difference of X-ray absorption amounts between each layer and by exposing X-rays in parallel to the direction of the laminate layer.

The present invention involves forming an X-ray mask having an unprecedented tight supermicrostructure by using a thin film crystal growth method. In this mask, it is fundamental to transmit X-rays through the layer of crystal structure deposited in the thickness direction of the layer so as to cross its interface in parallel thereto.

In comparison with the conventional method with the use of the same layer structure obtained by oblique deposition, the crystal growth method according to the present invention has the following three advantageous points.

First, a pattern can be formed with high precision, because a flat film thickness controllability of less than one atomic layer can be obtained. Second, thin film crystal growth on the whole side surface of a deep groove is possible, so that a thin film crystal growth on the side surface of the deep groove can be increased in density when the thin film is used for preventing X-ray penetration. These advantages are obtained under the condition of taking migration of a large growing seed on the crystal surface for maintaining flatness in thin film crystal growth. Third, with the use of a recently developed atomic layer epitaxy technique, the growing rate on the side surface can be made the same as the growing rate on the plane, regardless of the depth of a groove, and a very close pattern can be formed at one atomic layer intervals.

On the other hand, the present invention is limited to certain combinations of materials for growing crystals, and has a serious problem in achieving an appropriate contrast for a mask. Therefore, when the absorption coefficient of a typical material is calculated on the basis of a lattice matched compound semiconductor, the material which takes the largest difference of absorption coefficient between lattice matched compound semiconductors is a combination of GaP/AlP and Al-L lines. In this combination, there are obtained a contrast value 10 when the X-ray passing length is 1.57 $\mu$m and a contrast value 8 when the X-ray passing length is 1.4 $\mu$m. If the X-ray passing length of the Al-L line is 10

μm, the contrast takes 20,000,000 and the attenuation of X-rays by AlP is limited to ¼.

On the other hand, in the case of a combination of materials having a small difference of absorption coefficient, a mask of high contrast can be obtained by removing one portion by selective etching after crystal growth. For example, a combination of a GaAs and C-K line enables a contrast value 10 in a thickness of 0.17 μm and a contrast value 8 in a thickness of 0.15 μm, which is substantially the same absorption coefficient as that of gold as a typical X-ray absorber in an Al-L line. Therefore, even if only a compound semiconductor for carrying out very precise crystal growth is used, an X-ray mask can sufficiently be formed.

A substrate is a simple support for a thin film laminate body to be adhered, so that there is no particular limitation. However, in order to adhere a compound semiconductor thin layer, the substrate should be a crystal body for forming a thin film having uniform thickness and smoothness for a joint area.

BRIEF DESCRIPTION OF THE DRAWINGS

For a better understanding of the invention, reference is made to the accompanying drawings, in which:

FIGS. 1(A) and 1(B) are a cross-sectional view for explaining the prior art and an X-ray absorption characteristic diagram respectively.

FIGS. 2(A) and 2(B) are perspective views for explaining a method of manufacturing an X-ray exposure mask according to the present invention.

FIG. 3 is a perspective view for explaining the method of manufacturing the X-ray exposure mask according to the present invention.

FIG. 4 is a cross-sectional view of an X-ray exposure device used for the present invention.

FIGS. 5(A) and 5(B) are perspective views for explaining an enlarged part of FIG. 4.

FIG. 6 is a schematic view of an X-ray exposure mask made by an epitaxial crystal growth method according to the present invention.

FIG. 10 is an explanatory view showing a transcription condition of the X-ray exposure mask to a resist according to the present invention.

FIGS. 11(A) and 11(B) show exposure with the use of the X-ray exposure mask according to the present invention.

FIG. 14 shows the intensity distribution for the case of using the X-ray exposure mask according to the present invention.

FIG. 15 is a graph of intensity distribution for each value of a waveguide width T for the case of using the X-ray exposure mask according to the present invention.

FIG. 16 is a graph showing the minimum value (2y) of a pitch to the width of a core for the case of using the X-ray exposure mask according to the present invention.

Figure 7:
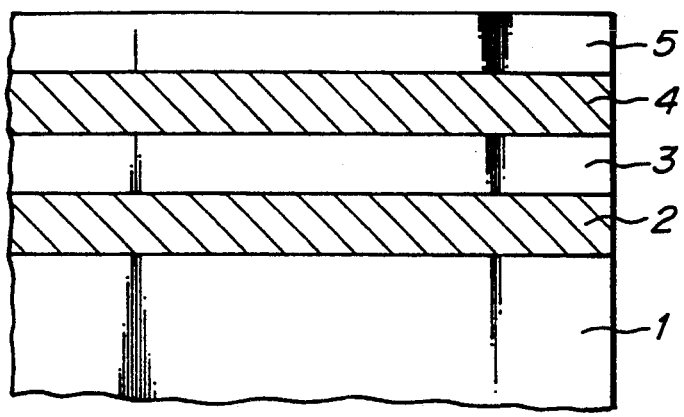
FIG. 7 is a schematic view showing a process of manufacturing an X-ray exposure mask according to the present invention.

Throughout different views of the drawing in FIGS. 1–16, 1 is an InP substrate, 2, 4 are a GaInAs thin film layer, 3, 5 are an InP thin film layer, 6 is a recessed portion, 7 is a direction of X-ray, H is an optical path length of X-ray, 8 is an electron gun, 9 is a Cu-target, 10 is an X-ray, 11 is a stage, 12 is a sample, 13 is a vacuum pump, 14 is a mask, 15 is a PMMA resist, 16 is an Si substrate, 17 is a direction of X-ray, L is a length acting as a mask, d is an optical path length of X-ray, Q is an angle for applying X-ray, 18 is an incident X-ray, 19 is an output X-ray, 20 is a stage, 21 is a transcription substrate, 22 is a resist, 23 is a mask substrate, 24 is an X-ray absorber, 25 is an incident electron ray, 26 is a Cu-target, 27 is a mask, 28 is a stage, 41 is a polyimide substrate, 41A is an aluminum substrate, 42 is a carbon thin film, 43 is a tungsten thin film, W is an X-ray absorption characteristic by tungsten, C is an X-ray absorption characteristic by carbon, 44 is a GaP substrate, 45, 47 are in AlP thin film layer, 46, 48 are a GaP thin film layer.

DESCRIPTION OF THE PREFERRED EMBODIMENTS

The present invention will be explained in detail as follows.

Microprocessing techniques have been studied for the purpose of speeding-up the integration of semiconductor devices. Moreover, devices have been invented based on a new principle with the aid of the quantum size effect of electroan wave diffraction devices and the like. In order to materialize such integration, a processing technique on the order of 10 nm is required. It is therefore necessary to use X-rays having very short wavelength for exposure. However, an X-ray exposure mask on the order of 10 nm has not yet been manufactured.

The present invention proposes to provide the manufacture of an X-ray exposure mask by an epitaxial crystal growth method. The epitaxial crystal growth method can manufacture a superlattice on the order of one atomic layer, so that a mask manufactured by this method is favorable as an X-ray exposure mask on the order of 10 nm. The present invention further aims at clarification of the possibility of manufacturing a mask by this method by actual exposure.

A method of manufacturing a mask according to the present invention is to manufacture a superlattice by an epitaxial crystal growth method by alternately laminating a plurality of InP/GaInAs thin film layers on an InP substrate. Only the GaInAs layer is etched by a sulfuric acid etching agent, and a comb-like mask is formed. In the present invention, an experiment was conducted by manufacturing masks of 400 nm pitch and 200 nm pitch respectively. With the use of these masks, X-rays were directed to polymethyl methacrylate (PMMA) as a resist applied onto a silicon (Si) substrate. After development, it was observed that a clear comb-like pattern was exposed in both 400 nm pitch and 200 nm pitch. It was confirmed from the above experiment that X-ray exposure can be carried out with the use of a superlattice as a mask.

Moreover, an X-ray mask exposure test was tried by selectively etching GaInAs in GaInAs/InP crystal, and as a result, a 100 nm pattern was successfully transcribed.

EMBODIMENTS

EXAMPLE 1

An embodiment of the present invention is explained in detail, by the drawings. FIG. 2(A) shows the condition of successively applying a compound semiconductor GaInAs layer 2, an InP layer 3, a GaInAs layer 4 and an InP layer 5 onto an InP substrate 1 by an epitaxial crystal growth method. The epitaxial growth method was carried out by an organic metal vapor phase epitaxy (OMVPE).

FIG. 2(B) shows the condition of selectively etching and removing a part of the GaInAs layers 2 and 4 by a sulfuric acid etching agent. The etched layer in this case is used as a comb-like X-ray exposure mask by forming uneven portions 6 by ion milling as shown in FIG. 3. Reference numeral 7 shows the X-ray irradiation direction, and shows irradiation [in] parallel to a cleavage surface of a thin film. In FIG. 3, when the portion H is more than 2000 Å, for the case of irradiating X-rays 7, a streak-like pattern due to the thickness of the thin films and to the difference of an X-ray absorption index is formed on a resist. In this case, a streak-like pattern can be formed whether or not the X-ray absorption coefficients of the thin films are different or the same.

EXAMPLE 2

A general outline of the method of manufacturing an X-ray mask by epitaxial crystal growth according to the present invention is explained.

First, a superlattice is manufactured by alternately laminating materials having different X-ray absorption coefficients by metal organic chemical vapor deposition (MOCVD). Whereby, since the absorption coefficient of GaP is large and the absorption coefficient of AlP is small, the materials are alternately laminated on a substrate 1 (See FIG. 3). For example, a first layer can have a small absorption coefficient followed by a large absorption coefficient and a small absorption coefficient. When an X-ray is incident parallel to the interface of a thin film as shown in FIG. 6, the X-ray transmission wave becomes uneven in strength and the superlattice performs the role of a mask. Here, in FIG. 6, 18 is an incident X-ray and 19 is an output X-ray. The illustrated case shows the formation of a film such as an AlP layer 45, a GaP layer 46, an AlP layer 47 and a GaP layer 48 on a GaP substrate 44.

Therefore, in order to obtain a contrast of X-rays passed through the mask, the superlattice should be constructed by a combination of materials having large differences of absorption coefficient.

Here, an equation for giving an absorption coefficient of a compound consisting of atoms A, B, C, . . . is as follows.

$$s = \frac{\rho}{m_S}\left(\frac{m_A}{S_A} + \frac{m_B}{S_B} + \frac{m_C}{S_C} + \cdots\right) \quad (1)$$

Here, l is the density of a compound semiconductor, $S_A$, $S_B$, $S_C$ . . . are absorption coefficients of respective atoms, $m_A$, $m_B$, $m_C$ . . . are the atomic weights of respective atoms, and $m_S$ is the molecular weight of the compound. Table 1 shows absorption coefficients of typical compound semiconductors.

TABLE 1

Absorption [coefficient] coefficients of compound [semiconductor] semiconductors ($\mu m^{-1}$)

| wavelength | GaAs | AlAs | InP | GaInAs | GaP | AlP |
|---|---|---|---|---|---|---|
| 0.83 nm (Al-L) | 2.85 | 1.53 | 1.27 | 2.54 | 1.6 | 0.13 |
| 1.33 nm (Cu-L) | 1.2 | 0.83 | 3.7 | 2.67 | 0.87 | 0.47 |
| 4.47 nm (C-K) | 13.7 | 10.7 | 6.5 | 10.6 | 11.9 | 8.6 |

Moreover, materials to be combined are restricted by lattice alignment, so that not too many different materials can be used. Within the range of Table 1, a combination of GaP and AlP has lattice alignment, for the case of the Al-L line (X-ray of wavelength 0.83 nm), if the superlattice transmits 1.57 μm X-rays passed through the GaP layer and X-rays passed through the AlP layer obtain a contrast of 10, and are suitably used as a mask.

An experiment of the present invention was conducted by setting the condition to be within a range in which the inventors could conduct a test. As materials, a combination of InP/GaInAs were lattice matched, and a superlattice was manufactured by an organic metal vapor phase growth method (OMVPE). Moreover, a Cu-L line (1.33 nm) was used. In this case, the absorption coefficients of X-ray are 3.7 ($\mu m^{-1}$) in GaInAs, and there is almost no difference. Therefore, a mask was manufactured by selectively etching GaInAs with a sulfuric acid etching agent.

Three layers of InP/GaInAs superlattices of 400 nm pitch and 200 nm pitch were grown using the organic metal vapor phase growth method (OMVPE). (See FIG. 7)

Figure 8:
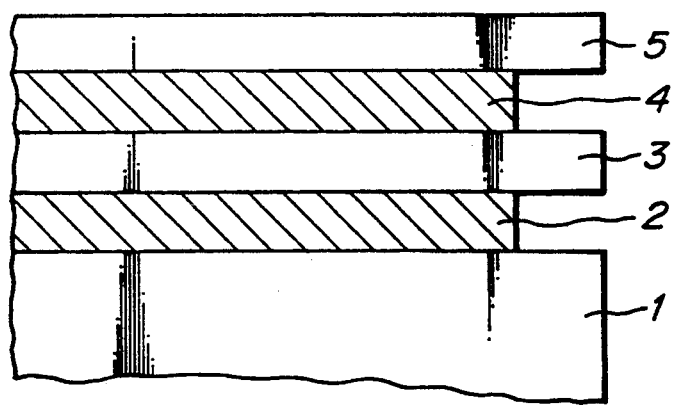
FIG. 8 is a schematic view showing the process of manufacturing the X-ray exposure mask according to the present invention.

The superlattice was cleared and its cleavage was etched with the use of a sulfuric acid etching agent ($H_2SO_4$:$H_2O_2$:$H_2O$=1:1:10) at 0° C. for 2 minutes. Thereby the GaInAs layer was selectively etched. Its depth was 300 nm. The result is shown in FIG. 8.

(2) Explanation of X-ray exposure device

FIG. 4 is a cross-sectional view of an X-ray exposure device. Reference numeral 8 is an electron gun, 9 is a Cu target, 10 is an X-ray, 11 is a stage, 12 is a sample, and an electron beam emitted from the electron gun 8 impinges on the Cu target 9, and an X-ray of the emitted Cu-L line (wavelength λ=1.33 nm) impinges on the sample 12 held by the stage 10. Reference numeral 13 is a vacuum pump.

FIG. 5(A) shows the condition of manufacturing a streaklike X-ray mask pattern on a resist material 15 consisting of PMMA (polymethyl methacrylate) with the use of an X-ray exposure mask manufactured by the method according to the present invention using the difference of X-ray absorption amounts. Here, 16 is a silicon (Si) substrate.

FIG. 5(B) is an enlarged view showing a part of FIG. 5(A). In FIG. 5(B), let L be the length acting as a mask and the depth of etching be L=300 nm.

L=dcosθ

Here, d is the optical path length of the X-ray, and d=435 nm in this experiment, and θ is an X-ray applying angle, and θ=45° in this experiment. When the InP absorption coefficient is α=3.7 $\mu m^{-1}$ and the contrast C=5, $$C = \exp(\alpha d)$$

In the X-ray exposure device shown in FIG. 4, as an X-ray source, use is made of a characteristic X-ray generated when the Cu target is excited by an electron beam. The acceleration voltage of the excited electron gun 8 was 6 kV, and only the Cu-L line ($\lambda = 1.33$ nm), the characteristic X-ray, was excited. In this case, electron energy converted into X-rays is about 0.1% and the rest becomes heat. Hence, the target had to be water cooled to prevent it from heating. The Cu-L line is long in wavelength and weak in transmission, so that it is impossible to take X-rays outside through a beryllium (Be) window such as the usual sealed-type tube bulb. Hence, both the mask and a transcription substrate are put in a SUS tube bulb and the whole was pumped to about $2 \times 10^{-6}$ Torr by a vacuum pump 13 and then used.

Figure 9:
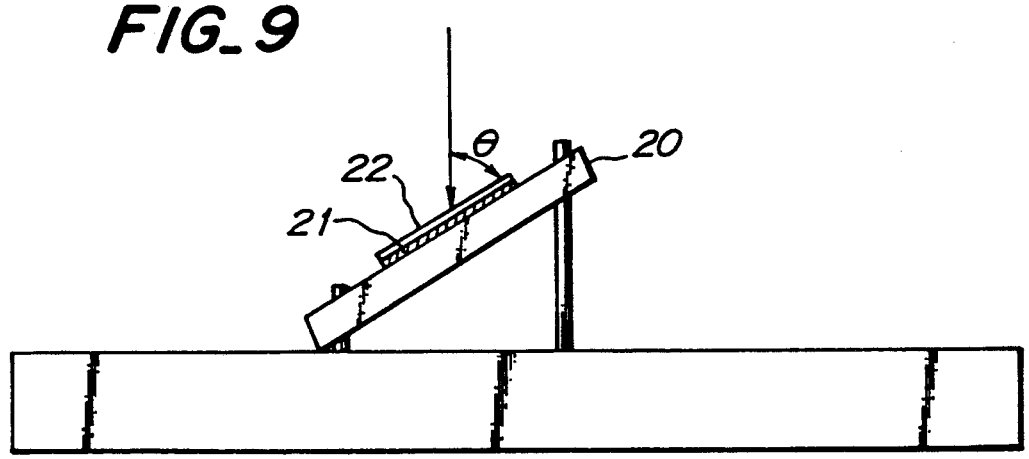
FIG. 9 is a schematic view of a flange of the device for manufacturing the X-ray exposure mask according to the present invention.

In order to put the present invention into practice, two points of a stage 11 and an extension tube were remodeled. First, newly manufactured stage 20 can freely change angles with respect to a flange, and X-rays can be applied to a transcription substrate 21 at a free angle. An outline of the flange is shown in FIG. 9.

Second, as to the extension tube, the distance from the Cu target to the transcription substrate was 9.0 cm, but it was made 39 m by inserting a tube of 30 cm. If the initial intensity is $I_0$, the intensity I of the X-rays in this case becomes as follows.

$$I = \frac{9^2}{39^2} + I_0 \simeq \frac{1}{20} \times I_0$$

Therefore, it becomes possible to expose with a precision of 20 times.

Moreover, let the distance from the X-ray source to the mask be L and the gap between the mask and the substrate be s. This generates a penumbral blur 6 as shown in FIG. 10. Here, $\delta$ is expressed as follows.

$$\delta = sd/L \tag{2}$$

Therefore, the distance L can be obtained by inserting an extension tube, and the penumbral blur $\delta$ can be controlled.

(2) X-ray exposure process:

(1) Resist application

A one m square silicon (Si) substrate is cut out, organically cleansed in order of methyl—trichlene-trichlene—methyl respectively for 5 minutes and substituted for pure water. PMMA (polymethyl methacrylate) (1:1) is applied thereto (first stage: 1 second 1000 rpm, second stage: 60 seconds 7000 rpm). PMMA (polymethyl methacrylate) is applied onto the Si substrate at a thickness of 1800Å. Thereafter, prebake is carried out at 170° C. for 1 hour.

(2) Exposure

As shown in FIGS. 11A and 11B, a mask 27 and a transcription substrate 21 are pressed to a stage 28. Moreover, the stage 28 is inclined to 45° for obtaining a suitable distance for passing X-rays through the mask 27. The exposure time is 3 minutes and 30 seconds.

(3) Development

Figure 12:
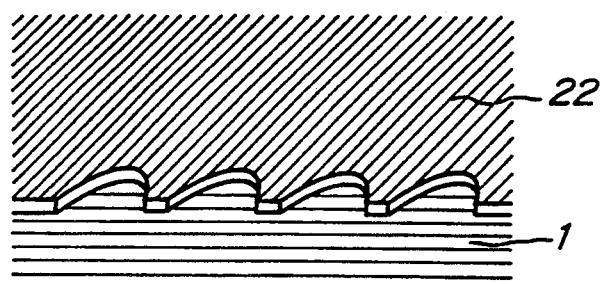
FIG. 12 is an enlarged cross-sectional view showing a transcription condition of the X-ray exposure mask to a resist (PMMA) on a substrate according to the present invention.

The transcription substrate 21 after exposure is developed with MIBK (methyl isobutyl ketone) 100% for 2 minutes, and rinsed with IPA (isopropyl alcohol) for 30 seconds. As a result, it was confirmed that a pattern of the mask 27 is transcribed to a resist 22. This is shown in FIG. 12.

(4) Calculation of contrast

The maximum distance d transmitting X-rays through the InP layer of a mask portion is determined by the depth L of etching and the inclined angle $\theta$ as shown in FIG. 5(B).

$$d = \frac{L}{\cos\theta} \tag{3}$$

In the present experiment, L=200 nm, $\theta = \pi/4$, and $d \approx 424$ nm.

Moreover, the contrast C between vacuum when transmitting by the distance x and material of the absorption coefficient $\alpha$ is expressed as follows.

$$C = \mathrm{EXP}(\alpha x) \tag{4}$$

The X-ray absorption coefficient of InP is 3.7 $\mu m^{-1}$ and the contrast when transmitting 424 nm is about 4.8.

(5) Allowable range of angular deviation

Figure 13:
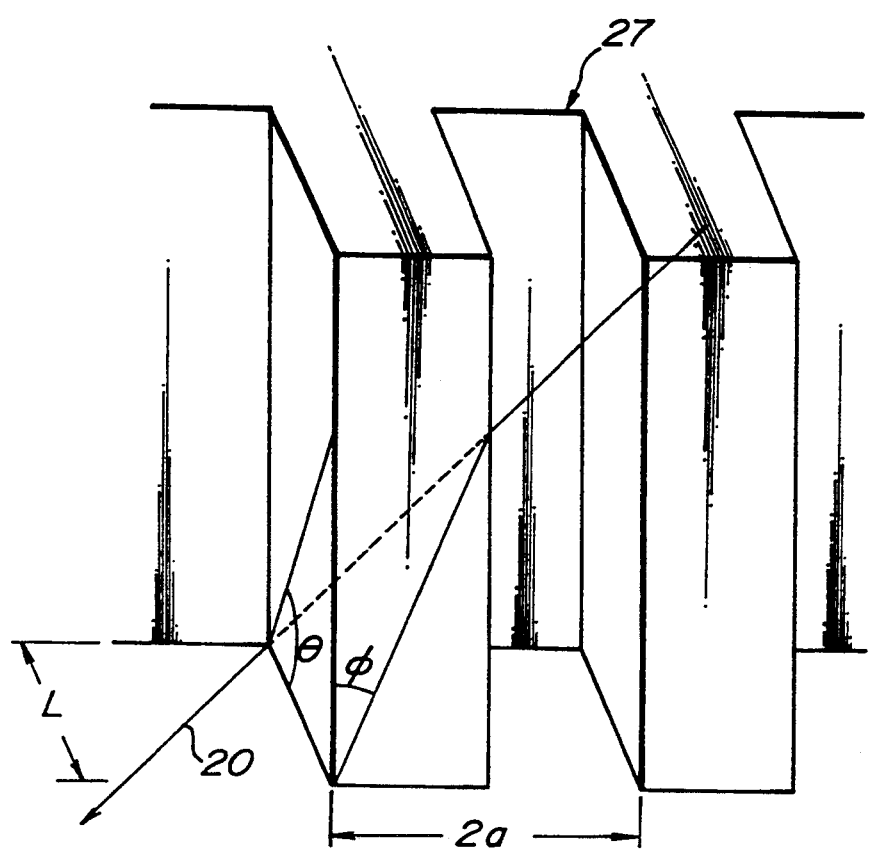
FIG. 13 is an explanatory view showing an allowable range of angle deviation for the case of using the X-ray exposure mask according to the present invention.

Let the pitch of a mask be 2a and the depth of etching be L, so that the limit angle $\phi$ of the X-ray incident angle deviation for the case of exposing with an angle $\phi$ can be obtained from the following relation as understood from FIG. 13.

$$\frac{a}{\tan\phi} = L\tan\theta \tag{5}$$

In the present invention, 2a=200 nm, L=300 nm, and $\theta = \pi/4$, so that $$\phi = \tan^{-1}\left(\frac{a}{L\tan\theta}\right) = 0.32[\mathrm{rad}] = 18°$$

This is a fully amendable range. However, if the pitch is made small, the depth of etching is limited by InP, so that in order to make the contrast about 5 from the equations (3) and (4), $\phi$ should be made small. Therefore, the allowable limit of angle $\theta$ becomes small. For example, if the pitch is made 50 nm, $\phi = 3.4°$, and angular alignment becomes very difficult. Moreover, for a 30 nm pitch as a target of the present experiment, $\phi = 2.0°$. The matter of this angular alignment determined the present pitch limit.

Reaction of PMMA:

Positive type resist PMMA (polymethyl methacrylate) used in the present invention becomes low molecular cutting of a high molecular chain of resist as shown in the following formula by non-elastic scattering and multi-stage reaction when an X-ray, electron beam or the like are incident, and is solved in a developer. This resist is low in sensitivity and plasma resistance, but can be expected to provide the highest resolution at present.

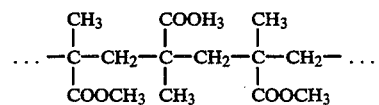

(the middle is omitted)

-continued

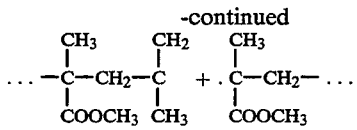

Limit of X-ray exposure:

An X-ray is short in wavelength and, as a beam for exposure, is expected to yield a very fine pitch in the future. However, since its energy is high, it has a small absorption coefficient. Therefore, a mask used for X-ray exposure becomes thick, and X-rays should pass a narrow long waveguide path. In this case, the X-ray spreads, and this spread can be calculated as follows.

Here, let the X-ray be Cu-L line (1.33 nm), core be vacuum, and clad be InP. First, a refractive index n of InP is obtained by the following equation.

$$n = 1 - 2.7 \times 10^8 \lambda^2 z \rho / A \tag{6}$$

Here, Z is an atomic number, $\rho$ is a density, A is an atomic number and $\lambda$ is a wavelength of the X-ray in MSK units. Upon calculation, it becomes $\Delta = 1 - n = 0.001$.

Here, when the width of the clad is made $2b$, a y axis is taken as shown in FIG. 14, and a standardized waveguide path width T is determined, energy distribution can be determined. However, T is as follows.

$$T = \frac{\pi 2b \sqrt{(2\Delta)}}{2} \tag{7}$$

The energy distribution for each value of T is shown in FIG. 15. (Energy E standardizes the maximum value 1.).

When the energy is 1/10 in FIG. 15, if a contrast is sufficient taken, the minimum pitch of each value of T is determined, and when the determined minimum pitch is made $2y$, a value of b is obtained from T, so that a graph of y can be drawn. It is shown in FIG. 16.

When the width of a core is about 10 nm, it is understood that about 20 nm of the minimum pitch is obtained. This is a limit of the pitch formed by X-ray exposure when InP is used as the clad.

Effect of the Invention:

The present invention alternately laminates two kinds of compound semiconductors as a thin film of about one atomic layer on a substrate of a crystal body with a periodic structure, selectively etches one material for forming this periodic structure, and forms an uneven difference of more than at least 2000Å between adjacent layers of said thin film laminate layers, so that even if X-ray absorption coefficients are the same in mutual thin films, a periodic structure is formed when there is a difference of sufficient X-ray absorption amounts. As a result, by projecting X-rays on a desired resist through the mask, an X-ray exposure mask can be manufactured by exposing a streak at certain intervals. Here, according to the method of the present invention, it is easy to make a film thickness of a compound semiconductor applied to a substrate about 10 nm, and it is also easy to take an optical path length of more than 2000Å by projecting X-ray in the direction of a laminate layer interface of cleavage of a thin film. Therefore, this yields the desired effect of precisely manufacturing an X-ray mask pattern having a thickness of less than 10 nm by a difference of X-ray absorption amounts.

What is claimed is:

1. A method of manufacturing an X-ray exposure mask comprising the steps of
    alternating laminating two kinds of compound semiconductors as a thin film to form a laminate body with controllability of about one atomic layer on a substrate;
    selectively etching only one of said semiconductors for forming a periodic structure;
    forming an uneven difference of X-ray absorption amounts between adjacent layers of said laminate body; and
    manufacturing a mask for exposing streaks on a desired resist with the aid of a difference of X-ray absorption amounts between each layer and by exposing X-rays in parallel to the direction of the laminate layer.

2. A method of manufacturing an X-ray exposure mask as claimed in claim 1, wherein the uneven difference formed between adjacent layers of said laminate body is between 2000 Å and 10 $\mu$m.

3. A method of manufacturing an X-ray exposure mask as claimed in claim 1, wherein said substrate is a crystal body.

4. A method of manufacturing an X-ray exposure mask, comprising the steps of:
    selecting a crystalline substrate having a substrate lattice constant and a surface;
    alternately fabricating a first and a second material on the surface of the crystalline substrate in layers having thicknesses less than about 10 Angstroms and having lattice constants approximately equal to said substrate lattice constant, said layers providing a path length T, wherein the first material has a first coefficient of absorption of X-rays and the second material has a second coefficient of absorption of X-rays; and
    selectively etching one of said first and second materials wherein said one of the first and second coefficients of absorption is sufficiently different from the absorption coefficient in vacuum and the path length T is sufficiently long such that X-rays traveling the path length T through said layers, produce X-ray intervals smaller than about 10 nanometers.

5. The method of manufacturing an X-ray exposure mask, as claimed in claim 4, wherein said alternately fabricating step comprises alternately epitaxially growing the first and second materials on said substrate.

* * * * *